US008369160B2

(12) United States Patent
Kim

(10) Patent No.: US 8,369,160 B2
(45) Date of Patent: Feb. 5, 2013

(54) DATA OUTPUT CIRCUIT OF SEMICONDUCTOR MEMORY AND RELATED METHOD

(75) Inventor: Jae IL Kim, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 235 days.

(21) Appl. No.: 12/838,342

(22) Filed: Jul. 16, 2010

(65) Prior Publication Data

US 2011/0188323 A1 Aug. 4, 2011

(30) Foreign Application Priority Data

Jan. 29, 2010 (KR) ........................ 10-2010-0008695

(51) Int. Cl.
*G11C 7/00* (2006.01)
*G11C 5/06* (2006.01)
*G11C 7/10* (2006.01)
*G11C 8/00* (2006.01)

(52) U.S. Cl. ................ 365/189.15; 365/63; 365/189.05; 365/233.1; 365/233.17

(58) Field of Classification Search .............. 365/189.15
See application file for complete search history.

(56) References Cited

U.S. PATENT DOCUMENTS

| | | | | |
|---|---|---|---|---|
| 4,800,530 A * | 1/1989 | Itoh et al. | ................. | 365/189.12 |
| 5,844,849 A * | 12/1998 | Furutani | ..................... | 365/194 |
| 6,163,501 A * | 12/2000 | Ohshima et al. | ......... | 365/189.05 |
| 6,294,937 B1 * | 9/2001 | Crafts et al. | ................. | 327/158 |
| 6,556,494 B2 * | 4/2003 | Morzano et al. | .............. | 365/219 |
| 6,754,120 B1 * | 6/2004 | Bellows et al. | ............... | 365/205 |
| 6,813,207 B2 * | 11/2004 | Honda | .......................... | 365/205 |
| 6,854,030 B2 | 2/2005 | Perino et al. | | |
| 6,987,704 B2 * | 1/2006 | Park | ........................ | 365/185.17 |
| 7,052,967 B2 | 5/2006 | Lee et al. | | |
| 7,187,195 B2 * | 3/2007 | Kim | ................... | 326/16 |
| 7,254,072 B2 * | 8/2007 | Kuroda | .................... | 365/203 |
| 7,800,957 B2 * | 9/2010 | Na | ........................ | 365/189.05 |
| 7,995,406 B2 * | 8/2011 | Lee | .......................... | 365/189.16 |
| 7,995,419 B2 * | 8/2011 | Sato | ........................ | 365/230.03 |
| 2009/0300255 A1 * | 12/2009 | Faue | ............................ | 710/305 |
| 2010/0034045 A1 * | 2/2010 | Sato | .............................. | 365/236 |

FOREIGN PATENT DOCUMENTS

| | | |
|---|---|---|
| JP | 2000-029925 | 1/2000 |
| JP | 2005-197637 | 7/2005 |
| KR | 1020020004860 | 1/2002 |

* cited by examiner

*Primary Examiner* — Son Mai
(74) *Attorney, Agent, or Firm* — William Park & Associates Ltd.

(57) ABSTRACT

Various embodiments of a data output circuit of a semiconductor memory and related method are disclosed. In one exemplary embodiment, a data output circuit may include a plurality of global lines, a sense amplifier block configured to output a plurality of data to the plurality of global lines at different timings, a pipe latch block configured to latch the plurality of data transmitted through the plurality of global lines at different timings, and a control unit configured to control output timings of the plurality of data from the sense amplifier block and latch timings of the pipe latch block using an address signal.

23 Claims, 6 Drawing Sheets

DATA OUTPUT CIRCUIT OF SEMICONDUCTOR MEMORY AND RELATED METHOD

CROSS-REFERENCES TO RELATED APPLICATION

The present application claims priority under 35 U.S.C. §119(a) to Korean Patent Application No. 10-2010-0008695, filed on Jan. 29, 2010, in the Korean Intellectual Property Office, which is incorporated herein by reference in its entirety as if set forth in full.

BACKGROUND

1. Technical Field

Various embodiments of the present invention relate to a semiconductor memory, and more particularly, to a data output circuit of a semiconductor memory and related method.

2. Related Art

Global lines disposed in a semiconductor memory for transmitting data occupy a substantial portion of a peripheral circuit area. While a technology for minimizing the distance between the global lines is being developed, a coupling phenomenon, among other factors, hinders the reduction of the distance between the global lines.

Referring to FIG. 1, a conventional data output circuit 1 of a semiconductor memory may include a plurality of sense amplifiers IOSAs, a plurality of global lines GIO<0:7>, and a plurality of pipe latches.

The plurality of sense amplifiers IOSAs receive a plurality of data OCT<0:7>, respectively, in order. The plurality of sense amplifiers IOSAs sense the plurality of data OCT<0:7> according to a signal IOSTBP generated by a read command, and output the sensed data OCT<0:7> to the plurality of global lines GIO<0:7>.

The plurality of pipe latches latch the data loaded onto the plurality of global lines GIO<0:7> in response to another signal PINB, which is generated by the read command.

Since the plurality of sense amplifiers IOSAs operate commonly according to the signal IOSTBP, the plurality of data OCT<0:7> are loaded onto the plurality of global lines GIO<0:7> at the same time. Also, since the plurality of pipe latches operate commonly according to the signal PINB, the plurality of data OCT<0:7> are latched at the same time.

For example, as shown in FIG. 2, when the phases of the data loaded onto the adjoining global lines GIO<0:2> are different, coupling noise can be generated in data due to a coupling capacitance CC created between the adjoining global lines GIO<0:2>, as indicated by the dotted lines in the drawing.

Thus, in the conventional data output circuit of a semiconductor memory, the coupling noise causes deterioration in the data transmission characteristics, such as, for example, a data transmission speed.

SUMMARY

Accordingly, various exemplary embodiments of the invention may provide a data output circuit of a semiconductor memory that is capable of reducing coupling noise and thereby improve its data transmission characteristics.

To attain the advantages and in accordance with the purposes of the invention, as embodied and broadly described herein, one exemplary aspect of the invention may provide a data output circuit of a semiconductor memory comprising a plurality of global lines; a sense amplifier block configured to output a plurality of data to the plurality of global lines at different timings; a pipe latch block configured to latch the plurality of data transmitted through the plurality of global lines at different timings; and a control unit configured to control output timings of the plurality of data from the sense amplifier block and latch timings of the pipe latch block using an address signal.

In another exemplary aspect, a data output circuit of a semiconductor memory may comprise a sense amplifier block configured to sense a first data group and a second data group in response to a pair of first control signals having different activation timings; a plurality of global lines configured to transmit the first data group and the second data group sensed by the sense amplifier block; a pipe latch block configured to latch the first data group and the second data group transmitted through the plurality of global lines in response to a pair of second control signals having different activation timings; and a control unit configured to generate the pair of first control signals and the pair of second control signals using an address signal.

In still another exemplary aspect, a data output circuit of a semiconductor memory may comprise a sense amplifier block configured to sense a first data group and a second data group at the same timing and output sensed first and second data group in response to a pair of first control signals having different activation timings; a plurality of global lines configured to transmit the first data group and the second data group outputted from the sense amplifier block; a pipe latch block configured to latch the first data group and the second data group transmitted through the plurality of global lines in response to a pair of second control signals having different activation timings; and a control unit configured to generate the pair of first control signals and the pair of second control signals using an address signal.

Various exemplary aspects of the invention may also provide a method of processing data in a data output circuit of a semiconductor memory. The method may comprise: grouping a plurality of data into a first data group and a second data group; sensing the first data group and the second data group in response to a pair of first control signals having different activation timings; transmitting the sensed first data group and second data group to a pipe latch block through a plurality of global lines; and latching the transmitted first data group and second data group in response to a pair of second control signals having different activation timings.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

DETAILED DESCRIPTION

Figure 1:
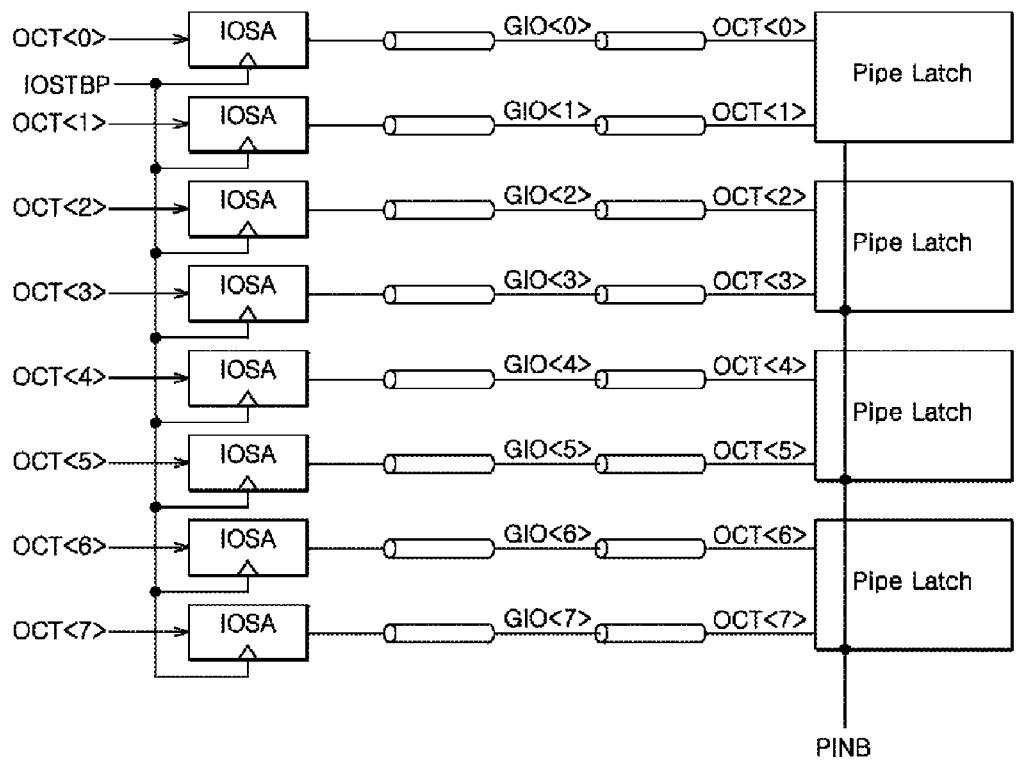
FIG. 1 is a block diagram illustrating a conventional data output circuit of a semiconductor memory.
Figure 2:
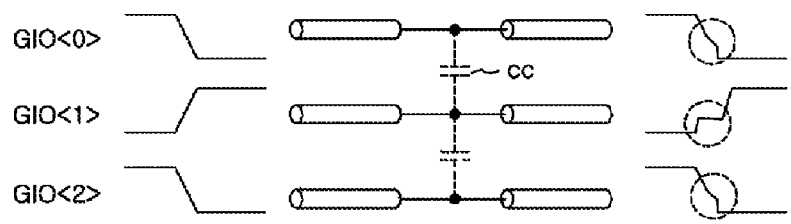
FIG. 2 is a diagram illustrating the data transmission waveforms of global lines in a conventional data output circuit.

Reference will now be made in detail to the exemplary embodiments consistent with the present disclosure, examples of which are illustrated in the accompanying drawings. Wherever possible, the same reference characters will be used throughout the drawings to refer to the same or like parts.

Before describing specific exemplary embodiments in detail, an operational principle of certain embodiments of the present disclosure will be described first.

Pipe latches determine data to be outputted first from 8-bit data OCT<0:7>, which depends on the level of an address (e.g., A2). For example, when address A2 designates data OCT<0:3> at a low level, data OCT<0:3> are outputted first, and then data OCT<4:7> are outputted. Thus, the output timing of data OCT<4:7> has a timing margin or delay period when compared to the output timing of data OCT<0:3>. Conversely, when address A2 designates data OCT<4:7> at a high level, data OCT<4:7> are outputted first, and then data OCT<0:3> are outputted. In this case, the output timing of data OCT<0:3> has a timing margin or delay period when compared to the output timing of data OCT<4:7>.

Certain exemplary embodiments consistent with the present disclosure may use the above-mentioned timing margin or delay period between the data to delay one half of the data to global lines at a timing later than the other half of the data.

Figure 3:
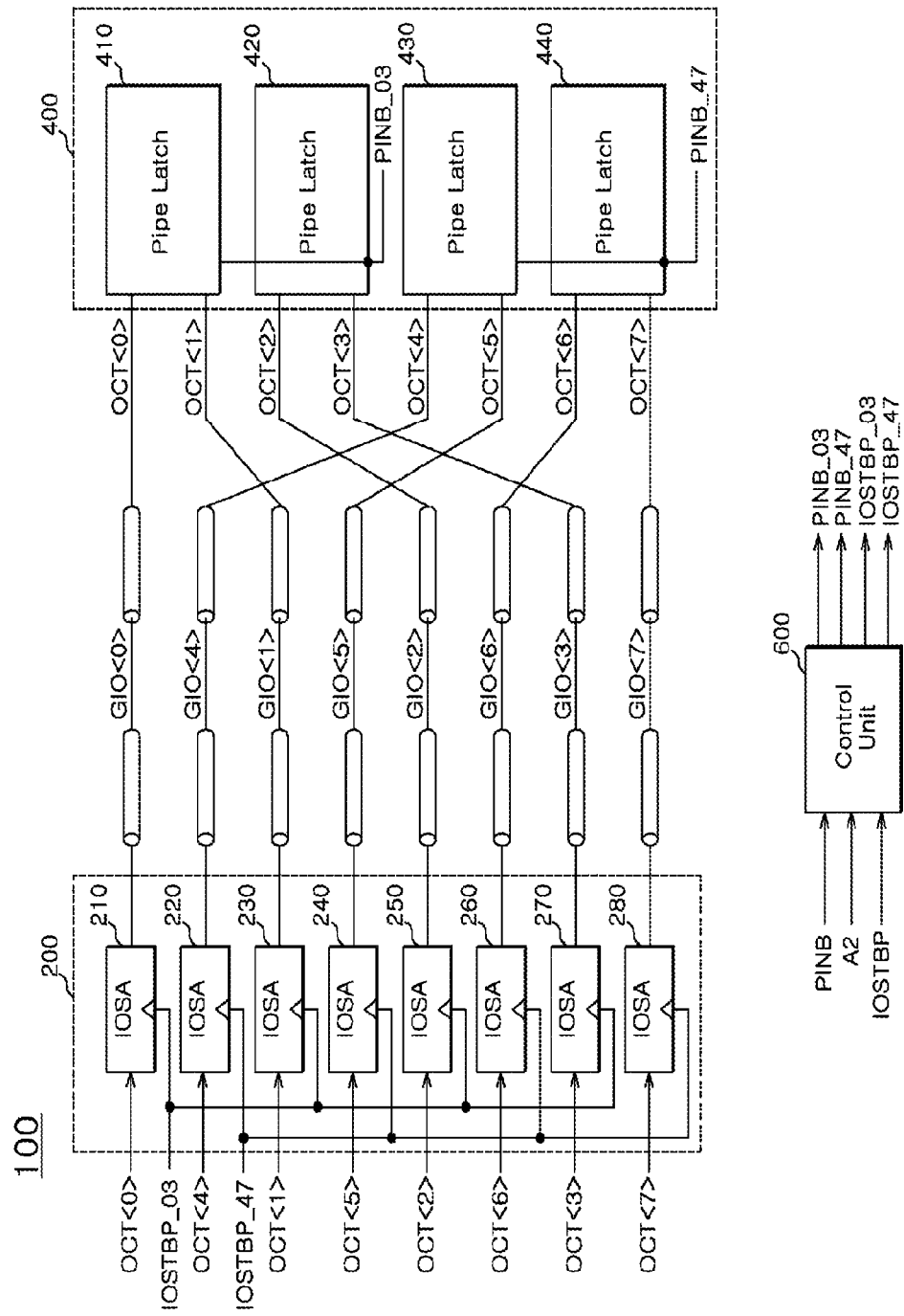
FIG. 3 is an exemplary block diagram illustrating a data output circuit of a semiconductor memory, consistent with certain disclosed embodiments of the present disclosure.

Referring to FIG. 3, a data output circuit 100 of a semiconductor memory in accordance with an exemplary embodiment of the present invention may include a sense amplifier block 200, a plurality of global lines GIO<0:7>, a pipe latch block 400, and a control unit 600.

Sense amplifier block 200 may be configured to classify a plurality of data OCT<0:7> into groups of data according to their order. For example, data OCT<0:7> may be classified into a first data group OCT<0:3> and a second data group OCT<4:7>. Sense amplifier block 200 may also be configured to sense first data group OCT<0:3> and second data group OCT<4:7> at timings different from one another in response to a pair of first control signals IOSTBP_03 and IOSTBP_47 and then output the sensed first data group OCT<0:3> and second data group OCT<4:7> to global lines GIO<0:7>.

Sense amplifier block 200 may include a plurality of sense amplifiers 210 through 280. Sense amplifiers 210, 230, 250 and 270 is may sense first data group OCT<0:3> in response to first control signal IOSTBP_03 and output sensed first data group OCT<0:3> to global lines GIO<0:3>. Sense amplifiers 220, 240, 260 and 280, on the other hand, sense second data group OCT<4:7> in response to first control signal IOSTBP_47 and output sensed second data group OCT<4:7> to global lines GIO<4:7>.

As a result, sense amplifiers 210 through 280 output the data in order of OCT<0>, OCT<4>, OCT<1>, OCT<5>, OCT<2>, OCT<6>, OCT<3> and OCT<7>.

In some exemplary embodiments, sense amplifiers 210 through 280 may be configured in the same manner as a conventional sense amplifier, such as, for example, the sense amplifier IOSA shown in FIG. 1.

Global lines GIO<0:3> and global lines GIO<4:7> may be alternately disposed one after another such that global lines GIO<0:7> may be arranged in the same order as the order of data OCT<0:7> outputted from sense amplifiers 210 through 280. That is, global lines GIO<0:7> may be arranged in order of GIO<0>, GIO<4>, GIO<1>, GIO<5>, GIO<2>, GIO<6>, GIO<3> and GIO<7>.

Pipe latch block 400 may be configured to latch first data group OCT<0:3> and second data group OCT<4:7> at timings different from one another in response to a pair of second control signals PINB_03 and PINB_47.

The pipe latch block 400 may include a plurality of pipe latches 410 through 440. Each of pipe latches 410 through 440 may be connected to two global lines selected from the plurality of global lines GIO<0:7>, which do not adjoin each other.

That is, global lines GIO<0:7> may be connected to pipe latches 410 through 440 in order of GIO<0>, GIO<1>, GIO<2>, GIO<3>, GIO<4>, GIO<5>, GIO<6> and GIO<7>.

Pipe latches 410 and 420, which constitute one half of pipe latches 410 through 440, may latch first data group OCT<0:3> in response to second control signal PINB_03. Pipe latches 430 and 440, which constitute the other half of pipe latches 410 through 440, may latch second data group OCT<4:7> in response to second control signal PINB_47.

Control unit 600 may be configured to generate the pair of first control signals IOSTBP_03 and IOSTBP_47 and the pair of second control signals PINB_03 and PINB_47 by bypassing and delaying a first source signal IOSTBP and a second source signal PINB in response to address signal A2. In some exemplary embodiments, control unit 600 may use control signals generated by any read command known in the art as first source signal IOSTBP and second source signal PINB.

Figure 4:
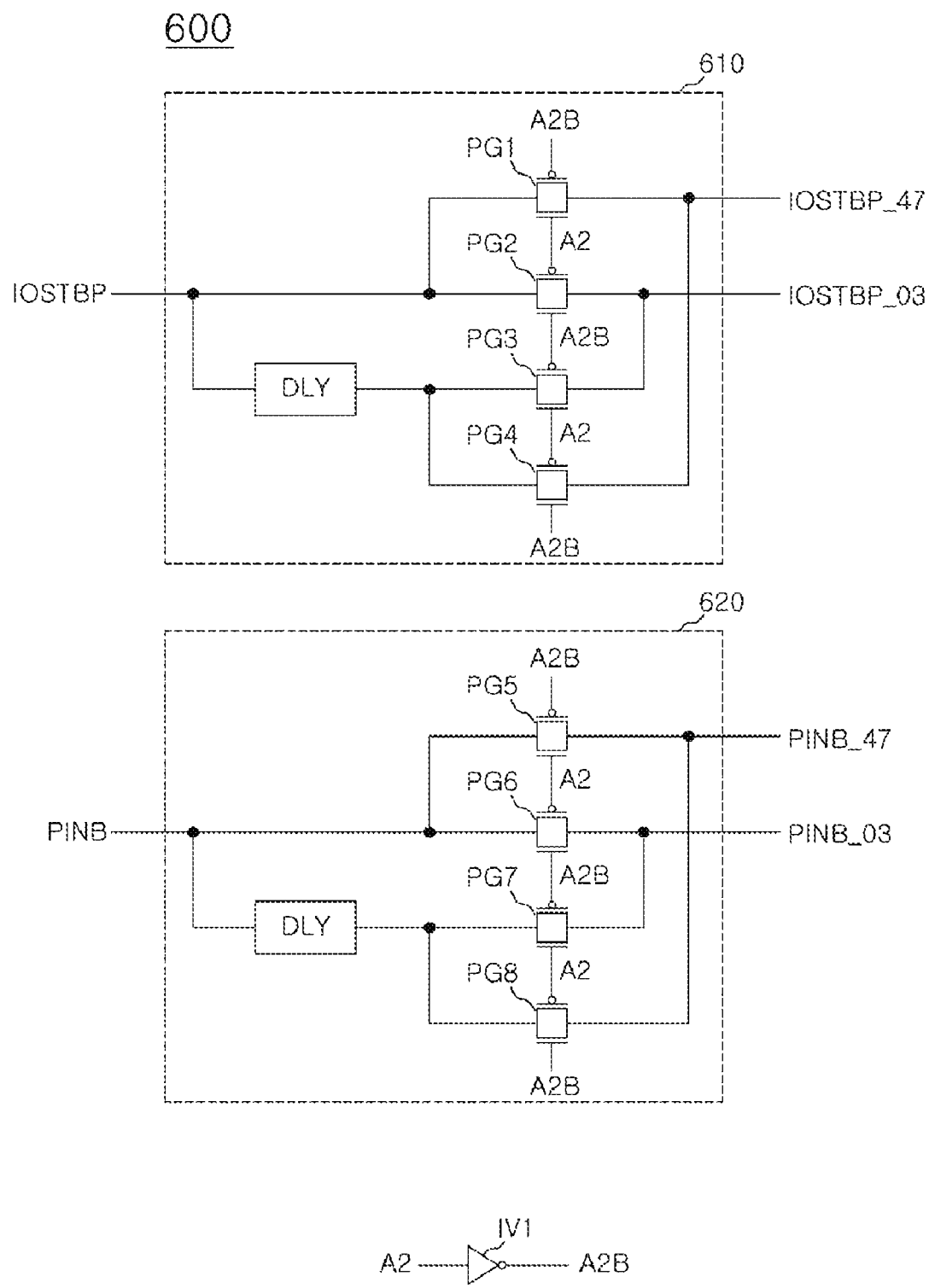
FIG. 4 is an exemplary circuit diagram of a control unit shown in FIG. 3, consistent with certain disclosed embodiments of the present disclosure.

Referring to FIG. 4, control unit 600 may include a first control section 610 and a second control section 620. Control unit 600 may further include an inverter IV1 for generating an inverted address signal A2B by inverting address signal A2. First control section 610 may include a delay element DLY and a plurality of pass gates PG1 through PG4.

When address signal A2 has a low level (i.e., a level at which data OCT<0:3> are designated), first control section 610 may bypass first source signal IOSTBP and output it as first control signal IOSTBP_03. Also, first control section 610 may delay first source signal IOSTBP and output it as first control signal IOSTBP_47.

When address signal A2 has a high level (i.e., a level at that data OCT<4:7> are designated), first control section 610 may delay first source signal IOSTBP and output it as first control signal IOSTBP_03. Also, first control section 610 may bypass first source signal IOSTBP and output it as first control signal IOSTBP_47.

Second control section 620 includes a delay element DLY and a plurality of pass gates PG5 through PG8. When address signal A2 has the low level (i.e., the level at which data OCT<0:3> are designated), second control section 620 may bypass second source signal PINB and output it as second control signal PINB_03. Also, second control section 620 may delay second source signal PINB and output it as second control signal PINB_47.

When address signal A2 has the high level (i.e., the level at which data OCT<4:7> are designated), second control section 620 may delay second source signal PINB and output it as second control signal PINB_03. Also, second control section 620 may bypass second source signal PINB and output it as second control signal PINB_47.

Operations of data output circuit 100 of a semiconductor memory according to certain exemplary embodiments of the present disclosure will be described below with reference to FIGS. 3 through 5.

When address signal A2 has the low level (i.e., the level in which data OCT<0:3> are designated), the pair of first control signals IOSTBP_03 and IOSTBP_47 and the pair of second control signals PINB_03 and PINB_47 are generated using first source signal IOSTBP and second source signal PINB generated according to the read command.

Figure 5:
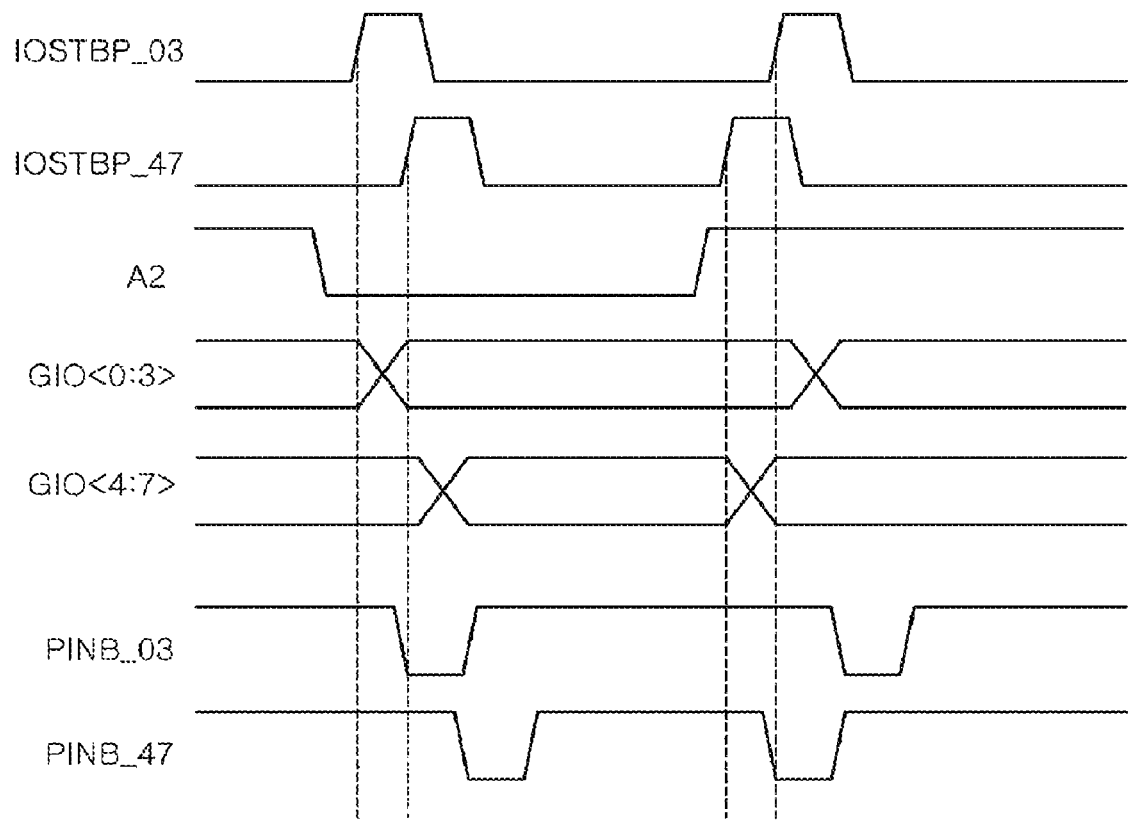
FIG. 5 is an exemplary diagram illustrating output waveforms, consistent with certain disclosed embodiments of the present disclosure.

As shown in FIG. 5, first control signal IOSTBP_03 from the pair of first control signals IOSTBP_03 and IOSTBP_47 may be activated earlier than first control signal IOSTBP_47. In response to the activated first control signal IOSTBP_03, sense amplifiers 210, 230, 250 and 270 may sense first data group OCT<0:3> and output sensed first data group OCT<0:3> to global lines GIO<0:3>.

Similarly, as shown in FIG. 5, second control signal PINB_03 from the pair of second control signals PINB_03 and PINB_47 may be activated earlier than second control signal PINB_47. In response to the activated second control signal PINB_03, pipe latches 410 and 420 may latch first data group OCT<0:3>, which has been transmitted through global lines GIO<0:3>.

In response to first control signal IOSTBP_47, which is activated after first control signal IOSTBP_03, sense amplifiers 220, 240, 260 and 280 may sense second data group OCT<4:7> and output the sensed second data group OCT<4:7> to global lines GIO<4:7>.

In response to the activated second control signal PINB_47, which is activated after second control signal PINB_03, pipe latches 430 and 440 may latch second data group OCT<4:7>, which has been transmitted through global lines GIO<4:7>.

Conversely, when address signal A2 has a high level (i.e., the level at which data OCT<4:7> are designated), the pair of first control signals IOSTBP_03 and IOSTBP_47 and the pair of second control signals PINB_03 and PINB_47 are generated using first source signal IOSTBP and second source signal PINB generated according to another read command.

As shown in FIG. 5, first control signal IOSTBP_47 from the pair of first control signals IOSTBP_03 and IOSTBP_47 may be activated earlier than first control signal IOSTBP_03. In response to the activated first control signal IOSTBP_47, sense amplifiers 220, 240, 260 and 280 may sense second data group OCT<4:7> and output sensed second data group OCT<4:7> to global lines GIO<4:7>.

Similarly, as shown in FIG. 5, second control signal PINB_47 from the pair of second control signals PINB_03 and PINB_47 may be activated earlier than second control signal PINB_03. In response to the activated second control signal PINB_47, pipe latches 430 and 440 may latch second data group OCT<4:7>, which has been transmitted through global lines GIO<4:7>.

In response to first control signal IOSTBP_03, which is activated after first control signal IOSTBP_47, sense amplifiers 210, 230, 250 and 270 may sense first data group OCT<0:3> and output the sensed first data group OCT<0:3> to global lines GIO<0:3>.

In response to the activated second control signal PINB_03n which is activated after second control signal PINB_47, pipe latches 410 and 420 may latch first data group OCT<0:3>, which has been transmitted through global lines GIO<0:3>.

In various exemplary embodiments of the present disclosure, such as, the embodiment shown in FIG. 5, the data level transition timings of global lines GIO<0:3> and GIO<4:7> may be different from each other, and each of the plurality of pipe latches 410 through 440 may latch the data of two global lines, which do not adjoin each other.

Figure 6:
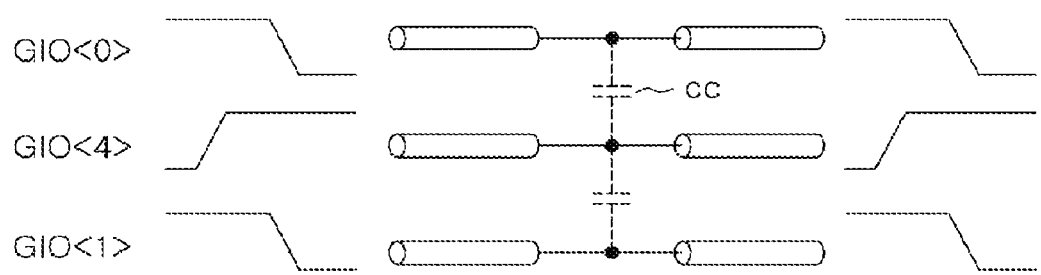
FIG. 6 is an exemplary diagram illustrating data transmission waveforms of global lines in the data output circuit, consistent with certain disclosed embodiments of the present disclosure.

Accordingly, as can be seen from FIG. 6, even when the phases of the data loaded onto adjoining global lines GIO<0>, GIO<4>, and GIO<1> are different, coupling noise can be reduced to the level that do not deteriorate the data transmission characteristics.

Figure 7:
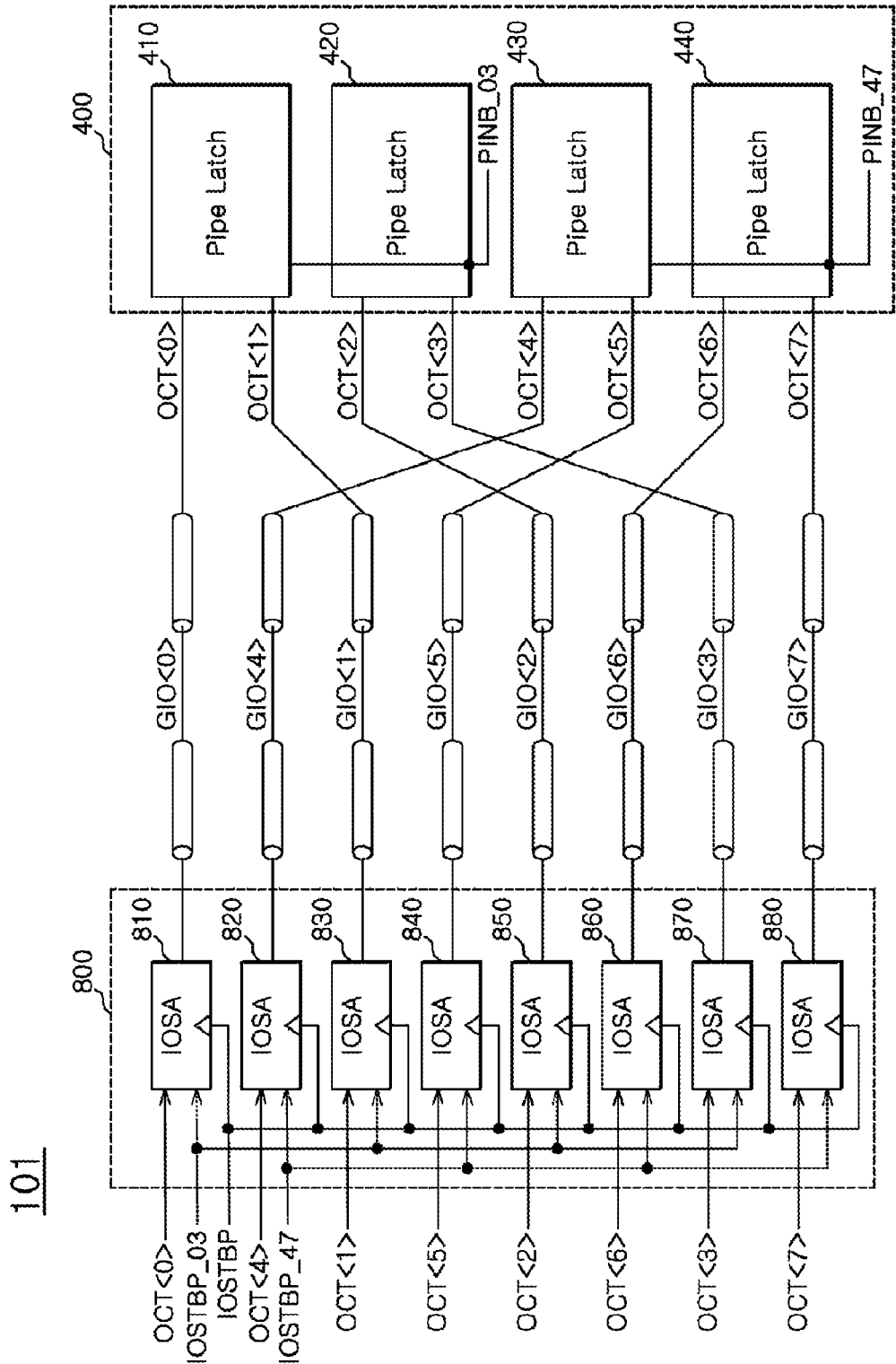
FIG. 7 is an exemplary block diagram illustrating a data output circuit of a semiconductor memory, consistent with certain disclosed embodiments of the present disclosure.

FIG. 7 is an exemplary block diagram illustrating a data output circuit 101 of a semiconductor memory according to another exemplary embodiment. Data output circuit 101 may include a sense amplifier block 800, a plurality of global lines GIO<0:7>, a pipe latch block 400, and a control unit 600.

Global lines GIO<0:7>, pipe latch block 400, and control unit 600 can be configured in the same manner as the embodiment shown in FIG. 3. The connection between sense amplifier block 800 and the plurality of global lines GIO<0:7> may also be the same as that of the embodiment shown in FIG. 3.

Sense amplifier block 800 may be configured to sense a first data group OCT<0:3> and a second data group OCT<4:7> at the same timing using a first source signal IOSTBP, and output the sensed first data group OCT<0:3> and second data group OCT<4:7> to the plurality of global lines GIO<0:7> at different timings in response to a pair of first control signals IOSTBP_03 and IOSTBP_47.

Sense amplifier block 800 may include a plurality of sense amplifiers 810 through 880. Sense amplifiers 810 through 880 can be identical to one another. Sense amplifiers 810 through 880 may sense first data group OCT<0:3> and second data group OCT<4:7> at the same timing using first source signal IOSTBP.

Sense amplifiers 810, 830, 850, and 870 may output sensed first data group OCT<0:3> to global lines GIO<0:3> in response to first control signal IOSTBP_03. Sense amplifiers 820, 840, 860, and 880 may output sensed second data group OCT<4:7> to global lines GIO<4:7> in response to first control signal IOSTBP_47.

Figure 8:
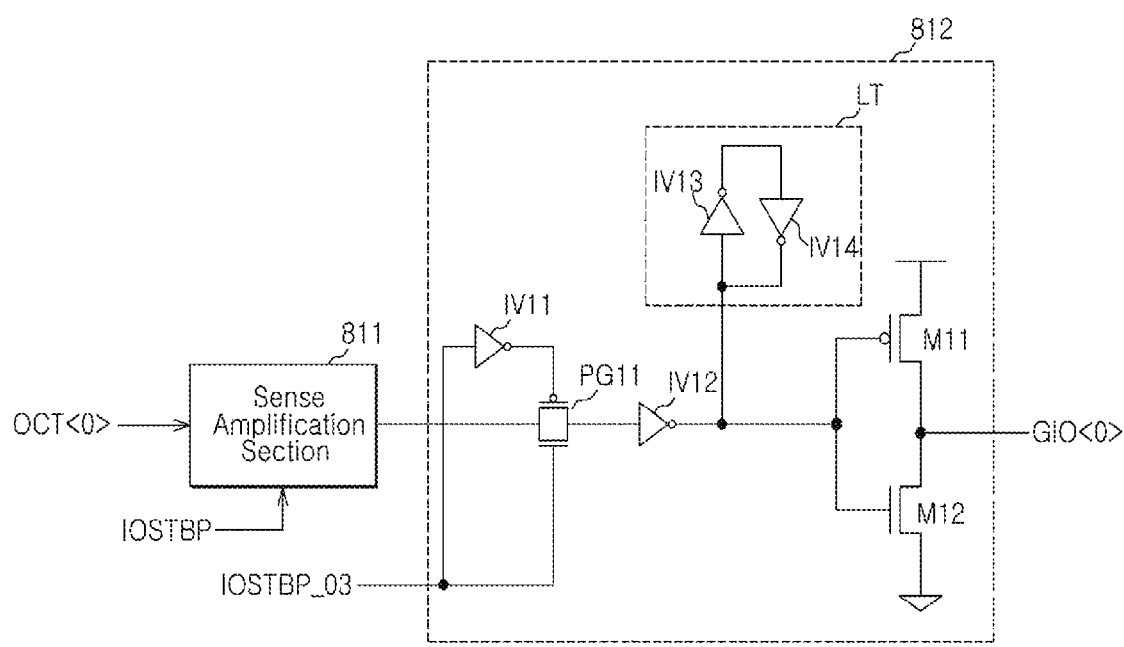
FIG. 8 is an exemplary circuit diagram of a sense amplifier shown in FIG. 7, consistent with certain disclosed embodiments of the present disclosure.

As shown in FIG. 8, sense amplifier 810 may include a sense and amplification section 811 and an output timing control section 812. In an exemplary embodiment, sense and amplification section 811 may have the same circuit configuration as sense amplifiers 210 through 280 shown in FIG. 3. Sense and amplification section 811 may be configured to sense data OCT<0> in response to first source signal IOSTBP.

Output timing control section 812 may include a plurality of inverters IV11 through IV14, a pass gate PG11, and a plurality of transistors M11 and M12. Inverters IV13 and IV14 may constitute a latch LT, and transistors M11 and M12 may constitute a driver.

In output timing control section 812, when first control signal IOSTBP_03 has a high level, pass gate PG11 may be turned on and may pass data OCT<0> which has been sensed by sense and amplification section 811.

As data OCT<0> passes through pass gate PG11, any one of the plurality of transistors M11 and M12 may drive global line GIO<0> to the level of data OCT<0>. Also, since data OCT<0>, which has passed through pass gate PG11, is stored in latch LT, the level of global line GIO<0> is maintained during an interval in which first control signal IOSTBP_03 has a low level.

While sense amplifiers 820, 840, 860, and 880 are configured in the same manner as the sense amplifier 810, they may be configured to receive first control signal IOSTBP_47 in place of first control signal IOSTBP_03.

Sense amplifiers 810, 830, 850, and 870 and sense amplifiers 820, 840, 860, and 880 may sense first data group OCT<0:3> and second data group OCT<4:7> at the same timing in response to first source signal IOSTBP.

However, sense amplifiers 810, 830, 850, and 870 and sense amplifiers 820, 840, 860 and 880 may output sensed data to global lines GIO<0:7> in response to first control signal IOSTBP_03 and first control signal IOSTBP_47, which have different activation timings.

Therefore, similar to the embodiment shown in FIG. 3, timings at which first data group OCT<0:3> and second data group OCT<4:7> are loaded onto global lines GIO<0:7> can be different from each other.

Thereafter, similar to the embodiment shown in FIG. 3, first data group OCT<0:3> and second data group OCT<4:7> may be latched by pipe latches 410 through 440.

As is apparent from the above description, the disclosed exemplary embodiments of a data output circuit of a semiconductor memory may reduce coupling noise by differentiating data transmission timings, which may result in reduction of the circuit area of a semiconductor memory and improvement of data transmission characteristics.

While certain embodiments have been described above with reference to illustrative embodiments for particular applications, it should be understood that the embodiments described are by way of example only. Those skilled in the art with access to the teachings provided in this disclosure will recognize additional modifications, applications, and/or embodiments and additional fields in which the present disclosure would be of significant utility. Accordingly, the disclosed data output circuit of a semiconductor memory described herein should not be limited to the described embodiments. Rather, they should only be limited in light of the claims that follow when taken in conjunction with the above description and accompanying drawings.

What is claimed is:

1. A data output circuit of a semiconductor memory, comprising:
   a plurality of global lines;
   a sense amplifier block configured to output a plurality of data to the plurality of global lines at different timings;
   a pipe latch block configured to latch the plurality of data transmitted through the plurality of global lines at different timings; and
   a control unit configured to control output timings of the plurality of data from the sense amplifier block and latch timings of the pipe latch block using an address signal, wherein the control unit is configured to generate a plurality of control signals for controlling the output timings of the sense amplifier block and the latch timings of the pipe latch block by bypassing or delaying a first source signal and a second source signal in response to the address signal.

2. The data output circuit according to claim 1, wherein the sense amplifier block is configured to classify the plurality of data into a first data group and a second data group according to an order of the plurality of data and output the first data group and the second data group to the plurality of global lines at the different timings.

3. The data output circuit according to claim 1,
   wherein the sense amplifier block is configured to classify the plurality of data into a first data group and a second data group according to an order of the plurality of data,
   wherein the sense amplifier block comprises a plurality of sense amplifiers arranged in a sequence, the plurality of sense amplifiers comprising a first group and a second group, the sense amplifiers in the first group and the sense amplifiers in the second group alternating one another in the sequence, and
   wherein the sense amplifiers in the first group and the sense amplifiers in the second group are configured to output the first data group and the second data group, respectively, to the plurality of global lines at the different timings.

4. The data output circuit according to claim 1,
   wherein the pipe latch block comprises a plurality of pipe latches, and
   wherein each of the plurality of pipe latches is connected to global lines that do not adjoin each other.

5. The data output circuit according to claim 1,
   wherein the sense amplifier block is configured to classify the plurality of data into a first data group and a second data group according to an order of the plurality of data,
   wherein the pipe latch block comprises a plurality of pipe latches configured to receive the plurality of data,
   wherein one half of the plurality of pipe latches and the other half of the plurality of pipe latches are configured to latch the first data group and the second data group, respectively, at the different timings.

6. The data output circuit according to claim 1, wherein the first source signal and the second source signal are generated by a read command.

7. A data output circuit of a semiconductor memory, comprising:
   a sense amplifier block configured to sense a first data group and a second data group in response to a pair of first control signals having different activation timings;
   a plurality of global lines configured to transmit the first data group and the second data group sensed by the sense amplifier block;
   a pipe latch block configured to latch the first data group and the second data group transmitted through the plurality of global lines in response to a pair of second control signals having different activation timings; and
   a control unit configured to generate the pair of first control signals and the pair of second control signals using an address signal,
   wherein the control unit is configured to delay an activation timing of one of the pair of first control signals and an activation timing of one of the pair of second control signals in response to the address signal.

8. The data output circuit according to claim 7, wherein the first data group and the second data group are classified by grouping a plurality of data according to an order of the data.

9. The data output circuit according to claim 7,
   wherein the sense amplifier block comprises a plurality of sense amplifiers arranged in a sequence, the plurality of sense amplifiers comprising a first group and a second group, the sense amplifiers in the first group and the sense amplifiers in the second group alternating one another in the sequence, and wherein the sense amplifiers in the first group are configured to sense the first data group in response to one of the pair of first control signals, and the sense amplifiers in the second group are configured to sense the second data group in response to the other one of the pair of first control signals.

10. The data output circuit according to claim 7, wherein the pipe latch block comprises a plurality of pipe latches, and wherein each of the plurality of pipe latches is connected to global lines that do not adjoin each other.

11. The data output circuit according to claim 7, wherein the pipe latch block comprises a plurality of pipe latches, and wherein one half of the plurality of pipe latches is configured to latch the first data group in response to one of the pair of second control signals, and the other half of the plurality of pipe latches is configured to latch the second data group in response to the other one of the pair of second control signals.

12. The data output circuit according to claim 7, wherein the control unit is configured to generate the pair of first control signals and the pair of second control signals by bypassing or delaying a first source signal and a second source signal in response to the address signal.

13. A data output circuit of a semiconductor memory, comprising:

a sense amplifier block configured to sense a first data group and a second data group at the same timing and output the sensed first and second data group in response to a pair of first control signals having different activation timings;

a plurality of global lines configured to transmit the first data group and the second data group outputted from the sense amplifier block;

a pipe latch block configured to latch the first data group and the second data group transmitted through the plurality of global lines in response to a pair of second control signals having different activation timings; and a control unit configured to generate the pair of first control signals and the pair of second control signals using an address signal, wherein the control unit is configured to delay an activation timing of one of the pair of first control signals and an activation timing of any one of the pair of second control signals in response to the address signal.

14. The data output circuit according to claim 13, wherein the first data group and the second data group are classified by grouping a plurality of data according to an order of the data.

15. The data output circuit according to claim 13,
wherein the sense amplifier block comprises a plurality of sense amplifiers configured to sense the first data group and the second data group at the same timing, the plurality of sense amplifiers being arranged in a sequence and comprising a first group and a second group, the sense amplifiers in the first group and the sense amplifiers in the second group alternating one another in the sequence, and wherein the sense amplifiers in the first group are configured to output the sensed first data group in response to one of the pair of first control signals, and the sense amplifiers in the second group are configured to output the sensed second data group in response to the other one of the pair of first control signals.

16. The data output circuit according to claim 13,
wherein the pipe latch block comprises a plurality of pipe latches, and wherein each of the plurality of pipe latches is connected with global lines that do not adjoin each other.

17. The data output circuit according to claim 13,
wherein the pipe latch block comprises a plurality of pipe latches, and wherein one half of the plurality of pipe latches is configured to latch the first data group in response to one of the pair of second control signals, and the other half of the plurality of pipe latches is configured to latch the second data group in response to the other one of the pair of second control signals.

18. The data output circuit according to claim 13, wherein the control unit is configured to generate the pair of first control signals and the pair of second control signals by bypassing or delaying a first source signal and a second source signal in response to the address signal.

19. A method of processing data in a data output circuit of a semiconductor memory, comprising:

grouping a plurality of data into a first data group and a second data group;

sensing the first data group and the second data group in response to a pair of first control signals having different activation timings;

transmitting the sensed first data group and second data group to a pipe latch block through a plurality of global lines;

latching the transmitted first data group and second data group in response to a pair of second control signals having different activation timings; and delaying an activation timing of one of the pair of first control signals and an activation timing of one of the pair of second control signals in response to the address signal.

20. The method of claim 19, wherein the first data group and the second data group are grouped based on an order of the plurality of data.

21. The method of claim 19, wherein sensing the first data group and the second data group comprises:

grouping a plurality of sense amplifiers arranged in a sequence into a first group and a second group, wherein the sense amplifiers in the first group and the sense amplifiers in the second group alternate one another in the sequence, sensing the first data group with the sense amplifiers in the first group in response to one of the pair of first control signals, and sensing the second data group with the sense amplifiers in the second group in response to the other one of the pair of first control signals.

22. The method of claim 19, wherein latching the transmitted first data group and second data group comprises:

grouping a plurality of pipe latches into a first latch group and a second latch group, latching the first data group with the first latch group in response to one of the pair of second control signals, and latching the second data group with the second latch group in response to the other one of the pair of second control signals.

23. The method of claim 19, further comprising generating the pair of first control signals and the pair of second control signals by bypassing or delaying a first source signal and a second source signal in response to the address signal.

* * * * *